United States Patent [19]
Tucker

[11] 3,942,172
[45] Mar. 2, 1976

[54] BIPOLAR MARK-SPACE ANALOGUE-TO-DIGITAL CONVERTER

[75] Inventor: Roger Lewis Raymond Tucker, Farnborough, England

[73] Assignee: The Solartron Electronic Group Limited, Farnborough, England

[22] Filed: June 13, 1974

[21] Appl. No.: 479,015

[30] Foreign Application Priority Data
June 29, 1973 United Kingdom............... 31027/73

[52] U.S. Cl......................... 340/347 NT; 324/99 D
[51] Int. Cl.² ................... H03K 13/02; H03K 13/20
[58] Field of Search............... 340/347 NT, 347 AD; 324/99 D

[56] References Cited
UNITED STATES PATENTS
2,798,667  7/1957  Spielberg et al. ............... 235/154 X
3,500,109  3/1970  Sugiyama et al. ......... 340/347 AD X Primary Examiner—Thomas J. Sloyan
Attorney, Agent, or Firm—William R. Sherman; Kevin McMahon

[57] ABSTRACT

The analogue to digital converter is of the bipolar mark-space type and includes an integrator for integrating the analogue input signal to be converted. A square wave generator is connected to the input of the integrator so as to superimpose a triangular periodic signal on the output signal produced by the integrator. First and second level detectors are connected to compare the output signal from the integrator with first and second detector levels respectively to produce first and second control signals respectively when the magnitude of the output signal from the integrator exceeds the first level and falls below the second level respectively. Switch means responsive to the first and second control signals are provided to respectively apply first and second reference signals. The conversion interval is set equal in duration to the duration of an integral number of cycles of the periodic triangular signal. A counter is provided for counting clock pulses during the application of either of the reference signal sources to the integrator.

15 Claims, 5 Drawing Figures

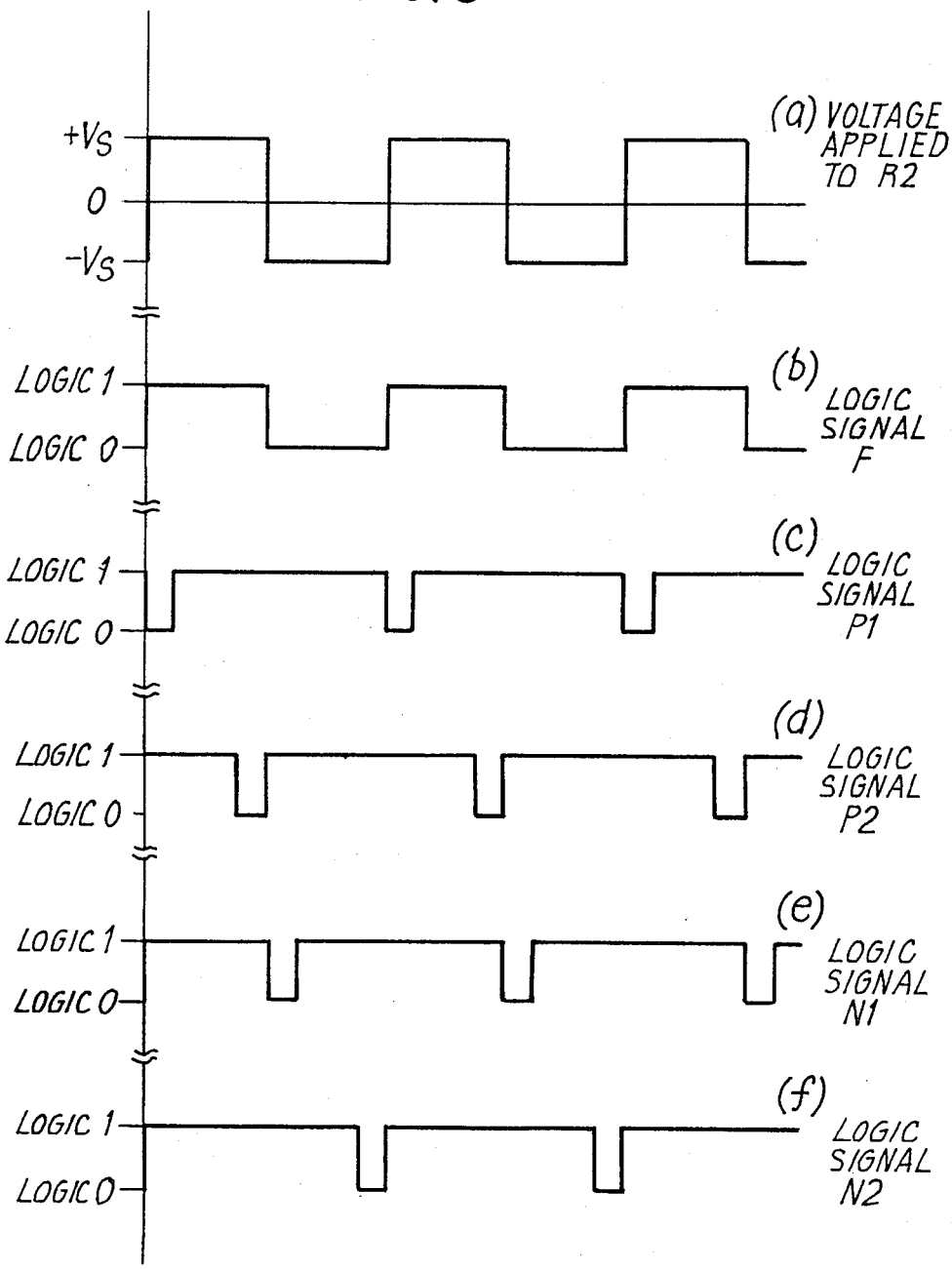

BIPOLAR MARK-SPACE ANALOGUE-TO-DIGITAL CONVERTER

This invention relates to analogue-to-digital converters, and is more particularly concerned with bipolar analogue-to-digital converters adapted to operate on the mark-space conversion principle.

In a known form of bipolar mark-space analogue-to-digital converter, as described for example in U.S. Pat. No. 3,500,109, the analogue input signal to be converted is continuously applied to an integrator, whose output is applied to one input of a single two-input level detector. The level detector compares the output of the integrator with a detector level applied to its other input, and a periodic signal is superimposed either on the output of the integrator or on the detector level. Whenever the magnitude of the signal at one input of the level detector exceeds the magnitude of the signal at its other input, the output of the level detector changes from a first state to a second state. The output of the level detector controls the application of two reference signals, equal in magnitude but opposite in polarity, to the input of the integrator, the positive reference signal being applied during the first state and the negative reference signal being applied during the second state. Equilibrium is reached when the mean input to the integrator, due to the analogue signal and the two reference signals, is zero. At this point it can be shown that the magnitude of a steady D.C. input current $I_{in}$ is given by $$I_{in} + I_{ref\ 1}\ t_1/T - I_{ref\ 2}\ t_2/T = 0,$$

where $I_{ref\ 1}$ and $I_{ref\ 2}$ are the aforementioned equal magnitude, opposite polarity, reference signals, $T$ is the period of the periodic signal, $t_1$ and $t_2$ are the respective durations of the application of the two reference signals, and $t_1 + t_2 = T$. Since the magnitudes of the two reference signals are supposed to be equal, this simplifies to $$I_{in} = t_2 - t_1/T\ I_{ref} = (t_2 - t_1) \times \text{a constant}$$

It is then possible to measure digitally the difference $t_2 - t_1$, to provide a digital representation of the magnitude of the analogue input signal.

This known form of bipolar mark-space analogue-to-digital converter suffers from the disadvantage that it is difficult to ensure that the two reference signals are precisely equal in magnitude. But if the respective magnitudes of the two reference signals are not precisely equal, the converter will suffer from a zero-offset problem. This is due to the fact that the two reference signals should be alternately applied to the integrator for precisely equal durations in response to a zero-magnitude analogue input signal, in order that the aforementioned difference between the durations should be zero. However, when the respective magnitudes of the two reference signals are slightly different, it is necessary for the smaller one to be applied to the integrator for a slightly longer duration than the larger one, in order that their mean, and therefore the mean input to the integrator, should be zero; thus when equilibrium is attained, the converter does not produce a correct zero reading.

It is an object of the present invention to provide a bipolar mark-space analogue-to-digital converter in which this zero-offset problem is substantially eliminated.

According to the present invention, therefore, a bipolar mark-space analogue-to-digital converter comprises:

integrating means for receiving an analogue input signal to be converted;

means for including a periodic signal in the output signal produced by the integrating means;

first and second level detectors connected to compare the output signal from the integrating means with first and second detector levels respectively, whereby analogue input signals of one polarity cause the magnitude of the output signal from the integrating means to exceed the first level by crossing it in a direction away from the second level, while analogue input signals of the other polarity cause the magnitude of the output signal from the integrating means to fall below the second level by crossing it in a direction away from the first level, the first and second level detectors being arranged to produce first and second control signals respectively when the magnitude of the output signal from the integrating means exceeds the first level and falls below the second level respectively;

first and second reference signal sources of opposite polarity;

switch means responsive to the first control signal to apply one of said reference signal sources, opposite in polarity to said one polarity of the analogue input signal, to the integrating means, said switch means being also responsive to the second control signal to apply the other of said reference signal sources to the integrating means;

means for defining a conversion interval equal in duration to the duration of an integral number of cycles of said periodic signal;

a source of clock pulses; and counter means for counting the clock pulses during the application of either of the reference signal sources to the integrating means, whereby the count in the counter means at the end of the conversion interval is a digital representation of the magnitude of the integral of the analogue input signal over the conversion interval.

The invention will now be described, by way of non-limitative example only, with reference to the accompanying drawings, of which:

FIG. 5 is an explanatory diagram showing the signal waveforms at various points in the circuit of FIG. 4.

Figure 1:
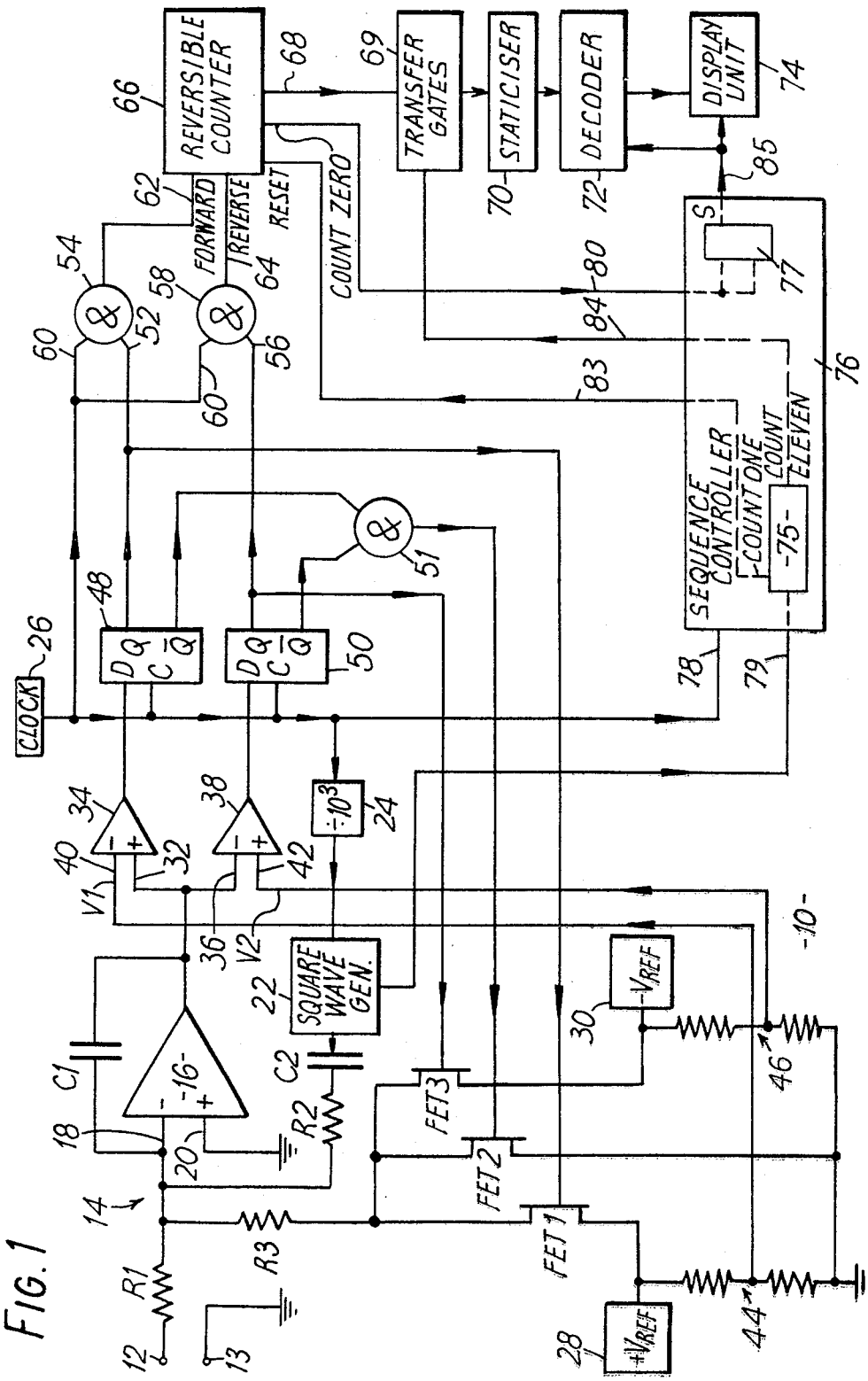
FIG. 1 is a simplified block circuit diagram of a bipolar mark-space analogue-to-digital converter in accordance with the present invention.

The converter shown in FIG. 1 is indicated generally at 10, and comprises a pair of input terminals 12, 13 to which an analogue-input signal to be converted is applied. The input terminal 12 constitutes the input of an integrating amplifier 14, which comprises a high gain differential amplifier 16 having inverting and non-inverting inputs 18, 20 respectively. An input resistor R1 is connected between the input terminal 12 and the inverting input 18, and an integrating capacitor C1 is feedback-connected from the output of the amplifier 16 to the inverting input 18. The input terminal 13 and the non-inverting input 20 of the amplifier 16 are both grounded.

The inverting input 18 of the amplifier 16 constitutes a summing junction, and the output of a square wave generator 22 is A.C. coupled thereto via the series combination of a capacitor C2 and a resistor R2. The square wave generator produces a square wave output at a typical frequency of 10kHz, and is connected to be driven via a divide-by-1000 frequency divider 24 by a clock pulse generator 26 having a typical operating frequency of 10MHz.

Also connected to the inverting input 18 of the amplifier 16 is one end of a resistor R3, whose other end is selectively connectable, via three transistor switches FET1, FET2 and FET3 in parallel, to a positive reference voltage source 28, ground, and a negative reference voltage source 30 respectively. Although the sources 28, 30 are opposite in polarity, their respective magnitudes, $\pm V_{REF}$, are substantially equal: typically they may be $+10$ volts and $-10$ volts respectively. Normally, one of the sources 28, 30 comprises a highly stable temperature-controlled zener diode (not shown), and the other is derived therefrom by inversion.

The output of the amplifier 16, which also constitutes the output of the integrating amplifier 14, is connected to the non-inverting input 32 of a differential amplifier 34 and to the inverting input 36 of a differential amplifier 38. The differential amplifiers 34, 38 both operate as level detectors, and for this purpose the inverting input 40 of the amplifier 34 is connected to receive a positive detector level voltage V1 while the non-inverting input 42 of the amplifier 38 is connected to receive a negative detector level voltage V2. The voltages V1 and V2, while opposite in polarity, are equal in magnitude (typically $\pm 4$ volts) and are derived from the sources 28, 30 respectively by means of respective similar potential dividers 44, 46.

The outputs of the level detectors 34, 38 are respectively connected to the respective D inputs of two D-type bistable circuits 48, 50, whose respective clock inputs are both connected to the output of the clock pulse generator 26. The Q output of the bistable circuit 48 is connected to the control input (gate) of the switch FET1, and the Q output of the bistable circuit 50 is connected to the control input of the switch FET3. The $\overline{Q}$ outputs of both bistable circuits 48, 50 are connected to respective inputs of a two-input AND gate 51, whose output is connected to the control input of the switch FET2. Additionally, the Q output of the bistable circuit 48 is connected to one input 52 of a two-input AND gate 54, while Q output of the bistable circuit 50 is connected to one input 56 of a two-input AND gate 58. The other input 60 of each of the AND gates 54, 58 is connected to the output of the clock pulse generator 26, while the output of the AND gates 54, 58 are respectively connected to the forward and reverse count inputs 62, 64 respectively of a reversible multi-decade BCD counter 66.

The counter 66 has a count output 68 connected via a set of transfer gates 69 to a staticiser 70. The staticiser 70 in turn is connected via a decoder 72 to a display unit 74, which may be of the known 7-segment light-emitting diode or liquid crystal type.

A sequence controller 76 has three control inputs 78–80 respectively connected to receive control input signals from the clock pulse generator 26, the square wave generator 22, and a detect zero output of the counter 66. The sequence controller 76 comprises a counter 75, which has a typical full house count of eleven and which is connected to be driven by the square wave applied to the control input 79 of the sequence controller 76, a bistable circuit 77 connected to be alternately set and reset by the signal applied to the control input 80 of the sequence controller 76, and further logic circuitry (not shown) such as gates and bistable circuits arranged in a conventional manner. Additionally, the sequence controller 76 has three control outputs 83–85, respectively constituted by the count one and count eleven outputs of the counter 75 and the set output of the bistable circuit 77, at which control outputs it produces respective control signals, as will hereinafter be described, for application to a reset input of the counter 66, the transfer gates 69 and the decoder 72 respectively. The control output 85 of the sequence controller 76 is also connected to a polarity display input of the display unit 74, while the control output 83 is internally connected to reset the bistable circuit 77.

Figure 2:
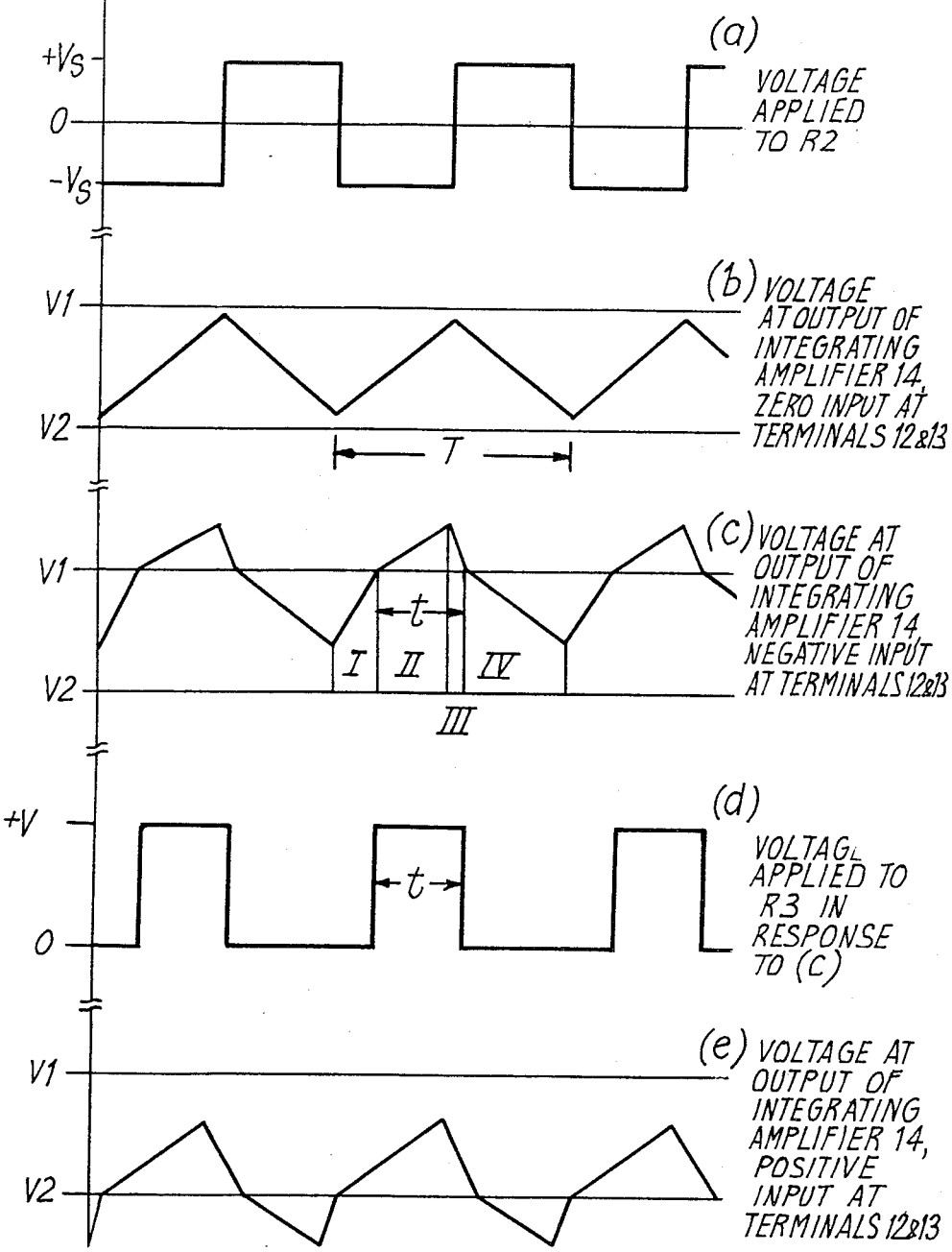
FIG. 2 is an explanatory diagram showing the signal waveforms at various points in the circuit of the converter of FIG. 1.

In operation, and assuming the Q output of the bistable circuits 48, 50 are initially in their logic 0 states, the switches FET1 and FET3 are open (non-conducting) and the switch FET2 is held closed (conducting) via the AND gate 51. The square wave produced by the square wave generator 26 is integrated by the integrating amplifier 14. Since the square wave is A.C. coupled to the integrating amplifier 14 via the capacitor C2, its mean D.C. level at the input of the resistor R2 is zero, and its waveform is as shown in FIG. 2(a). In the absence of an analogue input signal at the input terminals 12, 13, and ignoring the effects of any drift at the input of the amplifier 16, the integrating amplifier 14 therefore produces an output signal of triangular waveform, symmetrically disposed between the voltages V1 and V2, as shown in FIG. 2(b). The separation of the voltages V1 and V2 is preferably chosen to be just greater than the peak-to-peak amplitude of this triangular waveform.

When an analogue input signal in the form of a negative input voltage $-V_{IN}$ is applied to the input terminals 12, 13, the integrating amplifier 14 integrates it to produce a positive component in the triangular waveform output signal produced thereby. This positive component increases the slope of the positive-going flanks of the triangular waveform output signal and decreases the slope of the negative-going flanks, thus causing the positive peaks in the triangular waveform output signal to exceed the voltage V1, as shown in FIG. 2(c). Each time the voltage V1 is exceeded, the level detector 34 produces a logic 1 output signal, which is applied to the D input of the bistable circuit 48, so that the first clock pulse to occur after the voltage V1 is crossed in the positive direction sets the Q output of this bistable circuit to its logic 1 state. Similarly, when the output voltage produced by the integrating amplifier 14 falls below the voltage V1 (i.e. during each negative-going flank of the triangular waveform), the output signal produced by the level detector 34 and applied to the D input of the bistable circuit 48 reverts to its logic 0 state, so that the first clock pulse to occur thereafter sets the Q output of the bistable circuit back to its logic 0 state.

The logic 1 state at the Q output of the bistable circuit 48 is effective to close the switch FET1, thus applying the positive reference voltage source 28 to the integrating amplifier 14 in opposition to the input voltage at the terminals 12, 13. At the same time, the logic 1 state at the Q output of the bistable circuit 48 is also effective to enable the AND gate 54, thereby permitting clock pulses to be applied to, and forwardly counted in, the counter 66 throughout the duration of the application of the voltage source 28 to the integrating amplifier 14.

Equilibrium is reached, typically after a few cycles of the square wave from the square wave generator 26, when the mean input current to the integrating amplifier 14 is zero. Each cycle of the output signal from the integrating amplifier 14 can be divided into four successive periods, indicated by Roman numerals I to IV in FIG. 2(c), during which the input current $I_{total}$ to the integrating amplifier 14 is as follows:

$$I_{total} \text{ (period I)} = - \frac{V_{IN}}{R1} - \frac{V_S}{R2}$$

$$I_{total} \text{ (period II)} = - \frac{V_{IN}}{R1} - \frac{V_S}{R2} + \frac{V_{REF}}{R3}$$

$$I_{total} \text{ (period IV)} = - \frac{V_{IN}}{R1} + \frac{V_S}{R2}$$

where $2V_S$ is the peak-to-peak amplitude of the square wave from the square wave generator 26. The mean value of the components of current due to the square wave is zero, while the components due to $V_{IN}$ are present for the whole period T, where T is the period of the square wave. Thus, at equilibrium and assuming $-V_{IN}$ is constant, $$V_{IN} = R1./R3 \; V_{REF} \cdot t/t = \text{constant} \; x \; t$$

where $t$ is the duration of the application of the source 28 to the integrating amplifier 14.

Thus in order to measure the magnitude of the input voltage $-V_{IN}$, the sequence controller 76 produces a start signal at its output 83, which start signal is constituted by a count one output signal from the counter 75 and is therefore co-incident with a predetermined point in a cycle of the square wave from the square wave generator 26. In the embodiment of the invention shown in FIG. 1, this predetermined point is the beginning of a cycle: however this is not essential. This start signal resets the count in the counter 66 to zero, and resets the bistable circuit 77 if necessary. The counter 66 then counts clock pulses from the AND gate 54 throughout the duration of each application of the source 28, over a conversion (or measurement) interval whose duration is determined by the counter 75 in the sequence controller 76. The end of the conversion interval is indicated when the count eleven output of the counter 75 produces an output signal, which appears at the control output 84 of the sequence controller 76. Since this output signal is also co-incident with said predetermined point in, i.e. the beginning of, a cycle of the square wave, the duration of the conversion interval is equal to an integral number of cycles, ten in the described embodiment, of the square wave. This output signal enables the transfer gates 69, and is therefore effective to strobe the count in the counter 66 into the staticiser 70.

During the conversion interval, the sequence controller 76 receives no signal from the detect zero output of the counter 66, since this detect zero output is adapted to produce an output signal when the count in the counter 66 either goes from all zeroes to all nines in the reverse count direction or from all nines to all zeroes in the forward count direction. The bistable circuit 77 in the sequence controller 76 therefore remains in its reset state, which is arranged to set the decoder 72 to operate as a BCD to seven segment decimal decoder. The decoder 72 thus decodes the count held in the staticiser 70, and the decoded count is displayed by the display unit 74. The signal at control output 85 of the sequence controller 76 additionally causes the display unit 74 to display a negative polarity indication.

The next count one output signal from the counter 75 in the sequence controller 76 constitutes a further start signal, which causes the whole measurement cycle described above to be repeated. However, the display unit 74 continues to display the decoded value of the count held in the staticiser 70 until the end of the next conversion interval, when the new value of the count in the counter 66 is strobed into the staticiser.

When an analogue input signal in the form of a positive input voltage $+V_{IN}$ is applied to the input terminal 12, a negative component is introduced into the triangular waveform output signal produced by the integrating amplifier 14. This negative component increases the slope of the negative-going flanks of the triangular waveform output signal, and decreases the slope of the positive-going flanks, thus causing the negative peaks of the triangular waveform output signal to fall below (i.e. become more negative than) the voltage V2, as shown in FIG. 2(e). In a manner analogous to that already described with reference to negative analogue input voltages, the level detector 38 is tripped, thus causing the bistable circuit 50 to produce a logic 1 output signal at its Q output in response to an immediately subsequent clock pulse. The bistable circuit 50 in turn closes the switch FET3 to apply the negative reference voltage source 30 to the integrating amplifier 14 in opposition to the input voltage at the terminals 12, 13, and enables the AND gate 58 to permit clock pulses to be applied to the counter 66: the clock pulses are, however, counted in the reverse direction.

Equilibrium is reached, as already described, when the mean input current to the integrating amplifier 14 is zero, and the measurement is performed during the conversion interval, also as already described. However, this time the final count in the counter 66 is in nines complement form. But when the count in the counter 66 goes from all zeroes to all nines, the sequence controller 76 receives a signal from the detect zero output of the counter. This signal sets the bistable circuit 77 in the sequence controller 76, which in turn sets the decoder 72 to operate as a nines complement BCD to seven segment decimal decoder. This can be accomplished, for example, merely by complementing the signal at the input of the decoder 72 by means of switching circuitry, before its application to the main decoding circuitry. The correctly decoded output from the decoder is then displayed by the display unit 74, which additionally displays a positive polarity indication in response to the set signal from the bistable circuit 77, which appears at the control output 85 of the sequence controller 76.

The reason for employing a reversible counter as the counter 66 is as follows. Consider the case of a very small input voltage having a noise signal superimposed thereon. This noise signal may cause occasional reversal of the polarity of the input voltage during the conversion interval, so that the triangular waveform output signal produced by the integrating amplifier effectively moves up and down with respect to the voltages V1 and V2 and successively trips both of the level detectors 34, 38. Each time the level detector 34 is tripped, the counter 66 counts forwardly, each time the level detector 38 is tripped the counter 66 counts in reverse, and each time the count in the counter 66 goes from all zeroes to all nines or vice versa, a signal is produced at its detect zero output. The signals at the detect zero output of the counter 66 alternately set and reset the bistable circuit 77 in the sequence controller 76, so the state of the bistable circuit 77 indicates whether the net count in the counter 66 at any instant during the conversion interval is above zero, and therefore representative of an analogue input voltage having a mean negative value up to that instant, or below zero, and therefore representative of an analogue input voltage having a mean positive value up to that instant. It will be appreciated that the state of the bistable circuit 77 at the end of the conversion interval provides the signal at the control output 85 of the sequence controller 76.

Figure 3:
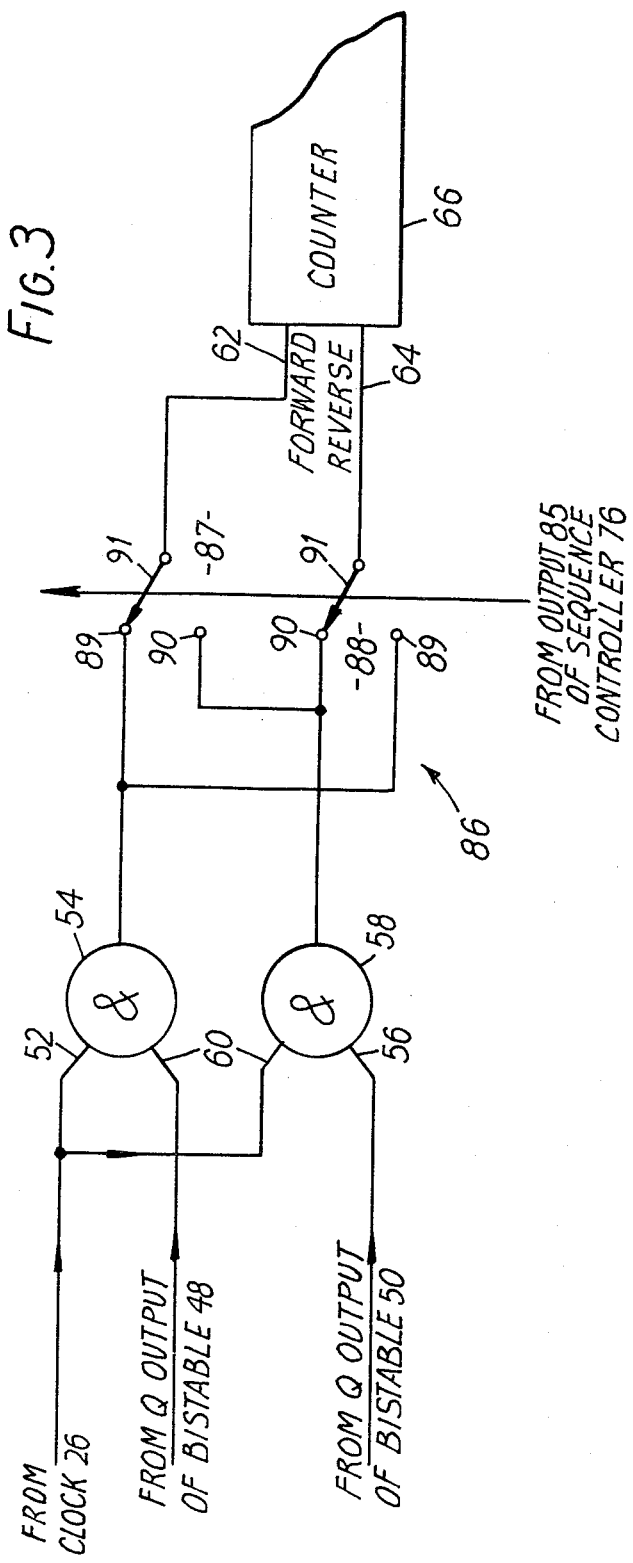
FIGS. 3 and 4 are respective circuit diagrams of alternative embodiments of two different parts of the converter of FIG. 1.

FIG. 3 shows an alternative embodiment of part of the converter 10, which embodiment avoids the necessity of providing the decoder 72 with the capability of operating in the nines complement BCD decoding mode. Elements similar to those described with reference to FIG. 1 are given the same reference numerals, and only the points of difference will be described. Thus the respective outputs of the AND gates 54, 58 are connected to the counter 66 via a switching circuit 86, which comprises two change-over switches 87 and 88 each having a first fixed contact 89 connected to the output of the AND gate 54 and a second fixed contact 90 connected to the output of the AND gate 58. Each of the switches 87, 88 has a movable wiper 91, the wipers 91 being ganged together. The wiper 91 of the switch 87 is normally in contact with the fixed contact 89 thereof, and is connected to the forward count input 62 of the counter 66, while the wiper 91 of the switch 88 is normally in contact with the fixed contact 90 thereof and is connected to the reverse count input 64 of the counter 66. Joint movement of the wipers 91 therefore interchanges the connection of the AND gates 54, 58 to the inputs 62, 64 of the counter 66.

The switches 87, 88 are shown as mechanical switches merely for simplicity: in practice they would be implemented as solid state switches.

The position of the wipers 91 is controlled by the control signal at the control output 85 of the sequence controller 76, which control signal is determined, as already described, by the signal from the detect zero output of the counter 66. However, in the FIG. 3 embodiment, the counter 66 is adapted to produce an output signal at its detect zero output when the count in the counter changes from a count of one to a count of zero.

Thus when the count in the counter 66 has initially increased from zero in response to clock pulses from the AND gate 54, due to a small negative input voltage, and then decreases again to zero in response clock pulses from the AND gate 58, due to a change in polarity of the input voltage, as the count reaches zero the output of the AND gate 58 is switched by the switching circuit 86 from the reverse count input 64 of the counter 66 to the forward count input 62, and the output of the AND gate 54 is correspondingly switched to the reverse count input 64. The counter 66 continues counting, but now counts forwardly, either until the end of the conversion interval, or until another polarity reversal of the input voltage causes the count in the counter 66 to again decrease to zero and again operate the switching circuit 86. The count in the counter 66 therefore cannot fall below zero, i.e. to a nines complement form. As before, the state of the bistable circuit 77 at any instant is representative of the polarity of the mean value of the analogue input voltage up to that instant.

Figure 4:
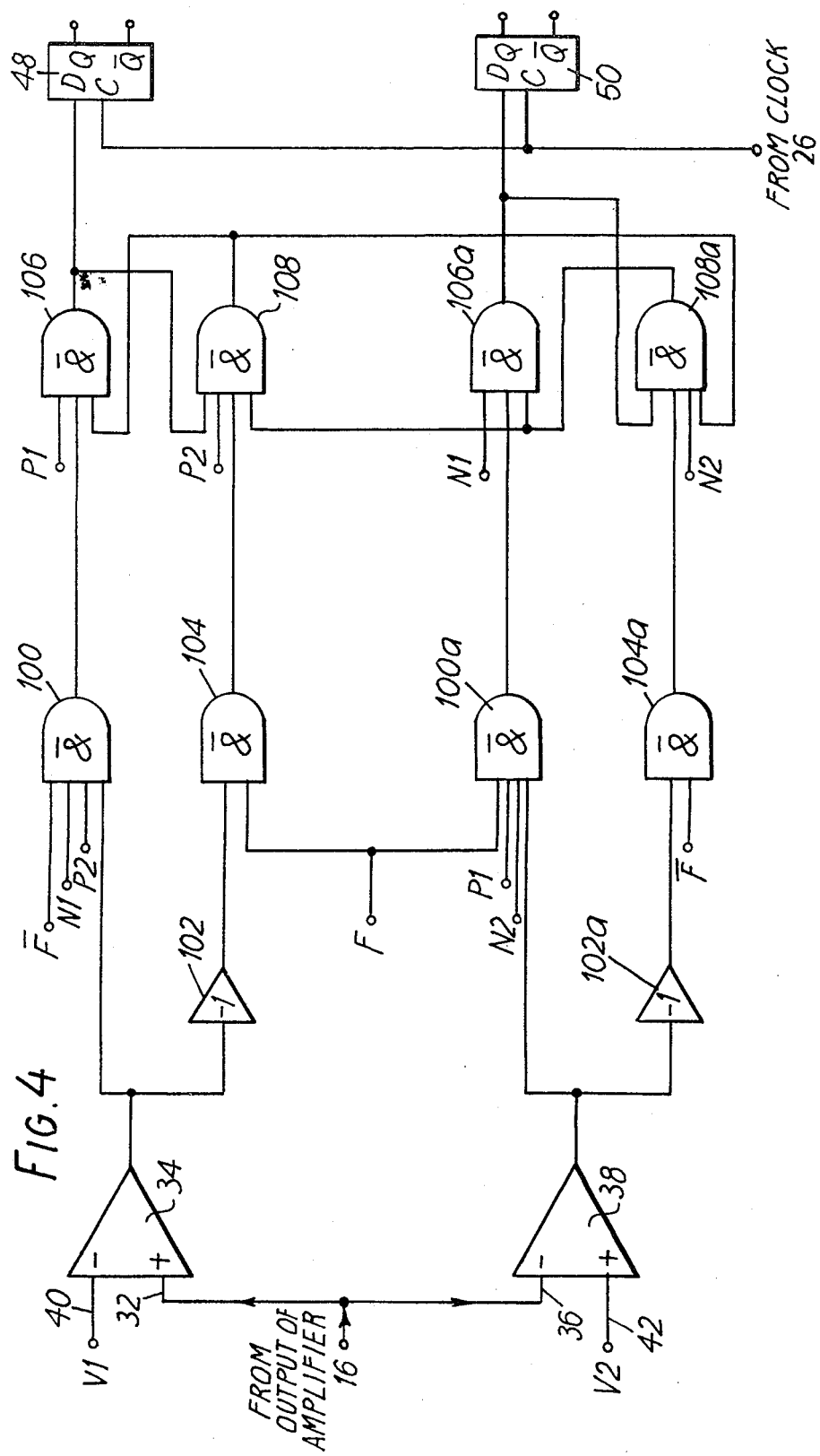

Turning now to FIG. 4, there is shown a modification to the circuitry of FIG. 1 for driving the bistable circuits 48, 50 from the level detectors 34, 38, which modification ensures that the switches FET1 and FET3 are each closed for a short digitally-defined time once per cycle of the square wave from the square wave generator 22, even when a zero amplitude analogue input signal is applied to the input terminals 12, 13 of the converter 10, so that neither of the level detectors 34, 38 is tripped. This modification improves the settling time of the converter 10 in response to very small analogue input signals. As before, elements similar to those described with reference to FIG. 1 are given the same reference numerals, and only the points of difference will be described.

Thus the output of the level detector 34 is connected to one input of a four-input NAND gate 100, and is also connected via an inverter 102 to one input of a two-input NAND gate 104. The other inputs of the NAND gate 100 are respectively connected to receive logic signals designated $\overline{F}$, N1 and P2, while the other input of the NAND gate 104 is connected to receive a logic signal designated F. The respective outputs of the NAND gates 100, 104 are connected to respective inputs of two further NAND gates 106, 108 respectively, whose respective outputs are cross-coupled to another input of each of the gates 108, 106, to form a latch. The NAND gate 108 has a further input connected to receive the logic signal designated P2, while the NAND gate 106 has a further input connected to receive a logic signal designated P1, and its output is connected to the D input of the bistable circuit 48.

Similarly, the output of the level detector 34 is connected to one input of a four-input NAND gate 100a and is also connected via an inverter 102a to one input of a two-input NAND gate 104a. The other inputs of the NAND gate 100a are respectively connected to receive the logic signals designated F and P1, and a logic signal designated N2, while the other input of the NAND gate 104a is connected to receive the logic signal designated $\overline{F}$. The outputs of the NAND gates 100a, 104a are connected to respective inputs of two further NAND gates 106a, 108a respectively, whose respective outputs are cross-coupled to another input of each of the gates 108a, 106a to form another latch. The NAND gate 108a has a further input connected to receive the logic signal designated N2, while the NAND gate 106a has a further input connected to receive a logic signal designated N1, and its output is connected to the D input of the bistable circuit 50.

Additionally, the respective outputs of the NAND gates 108, 108a are cross-coupled to yet further inputs of the NAND gates 108a, 108 respectively.

Each NAND gate is arranged to produce a logic level 0 output signal if and only if all its inputs receive a logic level 1 signal.

The waveforms of the logic signals designated F, P1, P2, N1, N2, and their timing relationship with the square wave produced by the square wave generator 22, are shown in FIG. 5, the square wave from the generator 22 being shown at (a), and the waveforms of the logic signals $\bar{F}$, P1, P2, N1, N2 being shown at (b), (c), (d), (e) and (f) respectively. These logic signals are derived from the square wave produced by the generator 22 in sequence controller 76. Thus the signal $\bar{F}$ is directly derived from the square wave, while the signal F is derived from the signal $\bar{F}$ by inversion. The signals P1, P2, N1, N2 are typically derived by appropriately decoding the outputs of a counter (not shown) which counts the high frequency clock pulses at the input 78 of the sequence controller 76 throughout each cycle of the square wave. For example, this counter is typically preceded by a divide-by-ten frequency divider (not shown) so that it receives pulses at 1 MHz, and has a full house count of one hundred achieved over precisely one cycle of the square wave. The count outputs of the counter are then decoded in conventional manner to set and reset latches to produce the signals P1, P2, N1, N2 in accordance with the following table:

| | COUNT IN COUNTER | |
|---|---|---|
| | From | To |
| Signal P1 is at logic level 0 | 0 | 01 |
| Signal P2 is at logic level 0 | 49 | 50 |
| Signal N1 is at logic level 0 | 50 | 51 |
| Signal N2 is at logic level 0 | 99 | 0 |

For the remainder of the time these signals are at logic level 1.

In operation, if the level detector 34 is tripped during a positive-going flank of the triangular waveform at the output of the integrating amplifier 14, i.e. while the signal $\bar{F}$ is at logic level 1, then the output signal of the NAND gate 100 goes to logic level 0. This forces the output signal of the NAND gate 106 to logic level 1, thus setting the Q output of the bistable circuit 48 to its logic level 1 state as described with reference to FIG. 1. At the same time the output signal of the NAND gate 108, which had been enabled via the inverter 102 and NAND gate 104, is forced to logic level 0, thus latching the NAND gate 106.

At the end of the positive-going flank, the signal $\bar{F}$ applied to the NAND gate 100 goes to logic level 0, and the signal P1 applied to the NAND gate 106 also goes to logic level 0 simultaneously therewith. The output signal of the NAND gate 106 therefore remains at logic level 1, until both the signal P1 and the output of the level detector 34 revert to their logic level 0 states, since it will be appreciated that the reversion of the output of the level detector 34 to its logic level 0 state is operative via the inverter 102 and NAND gate 104 to force the output signal of the NAND gate 108 to logic level 1.

If the level detector 34 is not tripped by the end of a positive-going flank of the triangular waveform, then the output signals of the NAND gates 100 and 108 are both at logic level 1. The output signal of the NAND gate 106 is therefore forced to logic level 1 during the brief interval when the signal P1 goes to logic level 0, and operates the bistable circuit 48 for this interval as already described.

It can clearly be seen in FIG. 4 that the arrangement and connection of the NAND gates 100a, 104a, 106a, and 108a and the inverter 102a between the level detector 38 and bistable circuit 50 is symmetrical with respect to the arrangement and connection of the NAND gates 100, 104, 106 and 108 and the inverter 102 between the level detector 34 and bistable circuit 48. Further, it can be seen in FIG. 5 that the time relationship of the signals N1, N2 to negative-going flanks of the triangular waveform is identical to the time relationship of the signals P1, P2 to the positive-going flanks of the triangular waveform. It will therefore be appreciated that the operation of the bistable circuit 50 by the level detector 38 or the signal N1, in relation to negative-going flanks, is exactly analogous to the operation of the bistable circuit 48 as already described.

The use of the signals P2, N2 forces a timing gap between the resetting of one of the bistable circuits 48, 50 and the setting of the other of these bistable circuits. Additionally, the cross-coupling between the NAND gates 108, 108a serves to prevent lock-up of the logic circuitry of FIG. 4 in response to certain transient operating conditions of the converter 10.

To summarise the effect of the logic circuitry of FIG. 4 on the operation of the converter 10, this circuitry ensures that the switches FET1 and FET3 are each successively closed once per cycle of the square wave from the square wave generator 22 for equal minimum periods, typically 1% of the duration of one cycle of the square wave, even if one or both of the level detectors 34 or 38 is not tripped: thus, if one of the level detectors 34, 38 is tripped but not the other, the switch FET1 or FET3 corresponding to the non-tripped level detector will still be closed for the aforementioned minimum period. Since minimum periods for which the positive and negative reference signal sources are applied to the integrating amplifier 14 are equal, the net DC current supplied to the integrating amplifier 14 during these minimum periods is zero, and the accuracy of the measurements is unaffected.

The operation of the logic circuitry of FIG. 4 leads to a very important advantage. Regardless of the magnitude of the analogue input signal applied to the converter 10, each of the reference voltage sources 28, 30 is applied to the integrating amplifier 14 the same equal number of times during the measurement interval. Thus any errors attributable to the time taken for the switches FET1 and FET3 to switch on and off are constant irrespective of the input signal magnitude, and can be calibrated out. We have found that a conversion linearity of a few parts per million over a very wide dynamic range of input signal magnitude can be achieved as a result of employing the logic circuitry of FIG. 4.

It can be shown that, in general, the duration of the period t is proportional to the integral of the input voltage $V_{IN}$ over any integral number of periods T of the square wave. It will be appreciated that the magnitude of the input current to the integrating amplifier 14 due to $V_S$ should be larger than that of the respective currents due to full scale negative input voltages.

If desired, the output of the square wave generator 22 can be phase-locked to a line-frequency signal, typically at 50 or 60 Hz. The duration of the conversion interval can then be made very closely equal to the duration of an integral number of cycles e.g. one, of the line-frequency signal, so as to provide excellent rejection of any series mode interference at the line frequency which may be superimposed on the input voltage.

It will be appreciated that by virtue of the use of separate reference voltage sources such as the sources 28, 30 for the measurement of negative and positive analogue input voltages respectively, the bipolar analogue-to-digital converter of the present invention avoids the zero offset problem mentioned hereinbefore. In practice, the result of any slight difference between the respective reference current applied to the integrating amplifier 14 from the sources 28, 30 is merely a slight difference in scale factor between measurements of positive and negative input voltages. This is much more acceptable to a user of the converter than is a zero offset, which is particularly objectionable when it is desired to use the converter in a measurement procedure requiring adjustment of some parameter to produce a null output signal measured by the converter.

Many modifications can be made to the described embodiment of the invention. In particular, a non-reversible counter may be used in place of the counter 66 in the basic embodiment described with reference to FIG. 1, for measurements where the expected noise content of the analogue input signal to be measured is low compared to the desired resolution of the measurements. Also, instead of connecting the square wave generator 22 to the input of the integrating amplifier 14, a summing circuit may be connected to receive the output of the integrating amplifier 14 and arranged to sum this output with a triangular waveform signal from a suitable waveform generator, the output of the summing circuit being applied to the level detectors 34, 38. Further, the switch FET2 may be omitted if desired, in view of the fact that the input 20 of the amplifier 16 is grounded. It will be understood that the expression "grounded" in this specification merely means connected to a signal low line, or zero volt line, since it is possible for the main circuitry of the converter 10 to be fully floating. Additionally, if desired, the separation of the voltages V1 and V2 may be chosen to be smaller than the peak-to-peak amplitude of the triangular waveform at the output of the integrating amplifier 14. Thus the level detectors 34, 38 are each tripped once per cycle of the triangular waveform, so that the logic circuitry of FIG. 4 can be omitted. Finally, since the conversion interval may be made as long as desired, the counter 66 may be arranged to operate in the floating point mode.

I claim:

1. A bipolar mark-space analogue-to-digital converter comprising:
   integrating means for receiving an analogue input signal to be converted;
   means for including a periodic signal component in the output signal produced by the integrating means in addition to the output signal component of the integrating means due to the analog input signal;
   first and second level detectors connected to compare the output signal from the integrating means with first and second detector levels respectively, whereby analogue input signals of one polarity cause the magnitude of the output signal from the integrating means to exceed the first level by crossing it in a direction away from the second level, while analogue input signals of the other polarity cause the magnitude of the output signal from the integrating means to fall below the second level by crossing it in a direction away from the first level, the first and second level detectors being arranged to produce first and second control signals respectively when the magnitude of the output signal from the integrating means exceeds the first level and falls below the second level respectively;
   first and second reference signal sources of opposite polarity;
   switch means responsive to the first control signal to apply one of said reference signal sources, opposite in polarity to said one polarity of the analogue input signal, to the integrating means, said switch means being also responsive to the second control signal to apply the other of said reference signal sources to the integrating means;
   means for defining a conversion interval equal in duration to the duration of an integral number of cycles of said periodic signal;
   a source of clock pulses; and
   counter means for counting the clock pulses during the application of either of the reference signal sources to the integrating means, whereby the count in the counter means at the end of the conversion interval is a digital representation of the magnitude of the integral of the analogue signal over the conversion interval.

2. A converter as claimed in claim 1, wherein the first and second reference signal sources are equal in magnitude.

3. A converter as claimed in claim 2, further including logic circuit means for operating the switch means, independently of the first and second control signals, to successively apply the positive and negative reference signal sources to the integrating means once per cycle of the periodic signal for equal short durations.

4. A converter as claimed in claim 2 wherein the first and second detector levels are also equal in magnitude but opposite in polarity.

5. A converter as claimed in claim 4, wherein the first and second detector levels are derived from the first and second reference signal sources.

6. A converter as claimed in claim 1, wherein the separation of the first and second detector levels is such that the peak-to-peak excursions of said periodic signal, in the absence of an analogue input signal, lie substantially wholly between the levels.

7. A converter as claimed in claim 1, wherein the periodic signal is of triangular waveform.

8. A converter as claimed in claim 7, wherein said means for including a periodic signal component comprises a square wave generator, and means for applying the square wave produced by the square wave generator to the integrating means to be integrated thereby, whereby to produce said triangular waveform at the output of the integrating means.

9. A converter as claimed in claim 8, wherein the means for applying the square wave to the integrating means includes an A.C. coupling.

10. A converter as claimed in claim 1, wherein the integrating means comprises a high gain inverting amplifier having an input and an output, an input resistance for receiving the analogue input signal connected to said input, and a feedback capacitor connected between said output and said input.

11. A converter as claimed in claim 10, wherein said means for including a periodic signal component comprises a square wave generator connected to the integrating means via an A.C. coupling and a second resistance connected to said input, and wherein the output of the switching means is connected to said input via a third resistance.

12. A converter as claimed in claim 1, wherein the counter means comprises a reversible counter, and means for causing the counter to initially count in one direction during the application of the first reference signal source and in the other direction during the application of the second reference signal source.

13. A converter as claimed in claim 12, wherein there is provided means for reversing the direction of counting of the counter, irrespective of which reference source is currently being applied to the integrating means, whenever the count in the counter reaches zero while counting in one direction.

14. A converter as claimed in claim 13, wherein said one direction is the reverse direction.

15. A converter as claimed in claim 1, wherein the switch means includes a further switch arranged to connect the input of the integrating means to ground when the signal at the output of the integrating means lies between said first and second detector levels.

* * * * *